United States Patent
Lee et al.

(10) Patent No.: US 11,367,484 B1
(45) Date of Patent: Jun. 21, 2022

(54) MULTI-STEP PRE-READ FOR WRITE OPERATIONS IN MEMORY DEVICES

(71) Applicant: Micron Technology, Inc., Boise, ID (US)

(72) Inventors: Yen Chun Lee, Boise, ID (US); Nevil N. Gajera, Meridian, ID (US); Karthik Sarpatwari, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/154,644

(22) Filed: Jan. 21, 2021

(51) Int. Cl.
| | | |
|---|---|---|
| G11C 11/4074 | (2006.01) | |
| G11C 16/10 | (2006.01) | |
| G11C 16/26 | (2006.01) | |
| G11C 16/34 | (2006.01) | |
| G11C 13/00 | (2006.01) | |

(52) U.S. Cl.
CPC ...... *G11C 13/0069* (2013.01); *G11C 13/0004* (2013.01); *G11C 13/004* (2013.01); *G11C 2013/0045* (2013.01); *G11C 2013/0057* (2013.01); *G11C 2013/0076* (2013.01)

(58) Field of Classification Search
CPC ............ G11C 13/0069; G11C 13/0004; G11C 13/004; G11C 2013/0045; G11C 2013/0057; G11C 2013/0076
USPC ......................................................... 711/154
See application file for complete search history.

(56) References Cited

U.S. PATENT DOCUMENTS

| 7,864,567 B2 | 1/2011 | Gordon et al. |
|---|---|---|
| 9,099,174 B2 | 8/2015 | Calderoni et al. |
| 9,275,730 B2 | 3/2016 | Tortorelli et al. |
| 9,613,691 B2 | 4/2017 | Mantegazza et al. |
| 10,431,301 B2 | 10/2019 | Mirichigni et al. |
| 10,566,052 B2 | 2/2020 | Mirichigni et al. |
| 10,755,781 B2 | 8/2020 | Robustelli |

(Continued)

FOREIGN PATENT DOCUMENTS

WO 2021176244 9/2021

OTHER PUBLICATIONS

Title: Reading a Multi-Level Memory Cell U.S. Appl. No. 16/926,557, filed Jul. 10, 2020 Inventor: Mattia Robustelli.

(Continued)

*Primary Examiner* — Ly D Pham
(74) *Attorney, Agent, or Firm* — Greenberg Traurig

(57) ABSTRACT

Systems, methods, and apparatus related to memory devices. In one approach, a memory device has a memory array including memory cells. A controller of the memory device applies multiple pre-read voltages to memory cells prior to performing write operations on the memory cells. The controller applies a first pre-read voltage to determine which of the memory cells have a sensed current that exceeds a threshold. In response to determining that a percentage of the memory cells exceeding the threshold is too low (e.g., below a fixed limit), the controller determines to apply a second pre-read voltage to the memory cells. The second pre-read voltage has a greater magnitude than the first pre-read voltage, and can be applied to ensure greater reliability in properly determining the existing programming state of the memory cells. The controller then applies write voltages to the memory cells as appropriate based on target logic states for each memory cell and the programming mode to be used by the controller.

20 Claims, 6 Drawing Sheets

(56) References Cited

U.S. PATENT DOCUMENTS

| | | | |
|---|---|---|---|
| 10,950,315 B1* | 3/2021 | Jeon | G11C 29/028 |
| 11,139,034 B1* | 10/2021 | Sarpatwari | G11C 13/0004 |
| 2013/0016562 A1 | 1/2013 | Mun | |
| 2015/0117129 A1 | 4/2015 | Jung | |
| 2016/0125952 A1* | 5/2016 | Hu | G11C 16/28 365/185.22 |
| 2018/0040370 A1 | 2/2018 | Tortorelli et al. | |
| 2018/0286495 A1 | 10/2018 | Oh et al. | |
| 2019/0198099 A1 | 6/2019 | Mirichigni et al. | |
| 2019/0295660 A1 | 9/2019 | Malshe et al. | |
| 2021/0011769 A1* | 1/2021 | Xie | G06F 9/5022 |
| 2022/0013183 A1* | 1/2022 | Sarpatwari | G11C 16/30 |

OTHER PUBLICATIONS

International Search Report and Written Opinion, PCT/IB2020/020022, dated Jan. 29, 2021.
Title: Adaptively Programming Memory Cells in Differenct Modes to Optimize Performance U.S. Appl. No. 17/221,415, filed Apr. 2, 2021 Inventors: Karthik Sarpatwari et al. Status: Application Undergoing Preexam Processing, Status Date: Apr. 2, 2021.
Title: Counter-Based Methods and Systems for Accessing Memory Cells U.S. Appl. No. 17/044,150, filed Sep. 30, 2020 Inventors: Riccardo Muzzetto et al. Status: Application Undergoing Preexam Processing, Status Date: Sep. 30, 2020.
Title: Identify the Programming Mode of Memory Cells based on Cell Statistics Obtained during Reading of the Memory Cells U.S. Appl. No. 17/221,417, filed Apr. 2, 2021 Inventors: Karthik Sarpatwari et al Status: Application Undergoing Preexam Processing, Status Date: Apr. 2, 2021.
Title: Identify the Programming Mode of Memory Cells during Reading of the Memory Cells U.S. Appl. No. 17/221,420, filed on Apr. 2, 2021 Inventors: Karthik Sarpatwari et al. Status: Application Undergoing Preexam Processing, Status Date: Apr. 2, 2021.
D.J.C. MacKay, S.T. Wilson, and M.C. Davey. Comparison of constructions of irregular gallager codes. IEEE Transactions on Communications, 47(10)-1449-1454, 1999.
Hangxuan Cui, Jun Lin, and Zhongfeng Wang, "Information storage bit-flipping decoder for LDPC codes", IEEE Transactions on Very Large Scale Integration (VLSI) Systems, 28(11):2464-2468, 2020.
R. Gallager, "Low-density parity-check codes," IRE Transactions on Information Theory, 8(1):21-28, 1962.
Tadashi Wadayama, Keisuke Nakamura, Masayuki Yagita, Yuuki Funahashi, Shogo Usami, and Ichi Takumi, "Gradient descent bit flipping algorithms for decoding LDPC codes", IEEE Transactions on Communications, 58(6):1610-1614, 2010.
Z. Li, L. Chen, L. Zeng, S. Lin, and W. Fong. Efficient encoding of quasi-cyclic low-density parity-check codes. IEEE Transactions on Communications, 53(11):1973-1973, 2005.

* cited by examiner

MULTI-STEP PRE-READ FOR WRITE OPERATIONS IN MEMORY DEVICES

FIELD OF THE TECHNOLOGY

At least some embodiments disclosed herein relate to memory devices in general, and more particularly, but not limited to memory devices that apply multiple pre-read voltages to memory cells when performing write operations.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

A storage device is an example of a memory device. Typical computer storage devices have controllers that receive data access requests from host computers and perform programmed computing tasks to implement the requests in ways that may be specific to the media and structure configured in the storage devices. In one example, a memory controller manages data stored in memory and communicates with a computer device. In some examples, memory controllers are used in solid state drives for use in mobile devices or laptops, or media used in digital cameras.

Firmware can be used to operate a memory controller for a particular storage device. In one example, when a computer system or device reads data from or writes data to a memory device, it communicates with the memory controller.

Memory devices typically store data in memory cells. In some cases, memory cells exhibit non-uniform, variable electrical characteristics that may originate from various factors including statistical process variations, cycling events (e.g., read or write operations on the memory cells), or a drift (e.g., a change in resistance of a chalcogenide alloy), among others.

In one example, reading a set of data (e.g., a codeword, a page) is carried out by determining a read voltage (e.g., an estimated median of threshold voltages) of memory cells that store the set of data. In some cases, a memory device may include an array of PCM cells arranged in a 3D architecture, such as a cross-point architecture to store the set of data. PCM cells in a cross-point architecture may represent a first logic state (e.g., a logic 1, a SET state) associated with a first set of threshold voltages, or a second logic state (e.g., a logic 0, a RESET state) associated with a second set of threshold voltages. In some cases, data may be stored using encoding (e.g., error correction coding (ECC)) to recover data from errors in the data stored in the memory cells.

For resistance variable memory cells (e.g., PCM cells), one of a number of states (e.g., resistance states) can be set. For example, a single level cell (SLC) may be programmed to one of two states (e.g., logic 1 or 0), which can depend on whether the cell is programmed to a resistance above or below a particular level. As an additional example, various resistance variable memory cells can be programmed to one of multiple different states corresponding to multiple data states, e.g., 10, 01, 00, 11, 111, 101, 100, 1010, 1111, 0101, 0001, etc. Such cells may be referred to as multi state cells, multi-digit cells, and/or multilevel cells (MLCs).

The state of a resistance variable memory cell can be determined (e.g., read) by sensing current through the cell responsive to an applied interrogation voltage. The sensed current, which varies based on the resistance of the cell, can indicate the state of the cell (e.g., the binary data stored by the cell). The resistance of a programmed resistance variable memory cell can drift (e.g., shift) over time. Resistance drift can result in erroneous sensing of a resistance variable memory cell (e.g., a determination that the cell is in a state other than that to which it was programmed, among other issues).

A PCM cell, for example, may be programmed to a reset state (amorphous state) or a set state (crystalline state). A reset pulse (e.g., a pulse used to program a cell to a reset state) can include a relatively high current pulse applied to the cell for a relatively short period of time such that the phase change material of the cell melts and rapidly cools, resulting in a relatively small amount of crystallization. Conversely, a set pulse (e.g., a pulse used to program a cell to a set state) can include a relatively lower current pulse applied to the cell for a relatively longer time interval and with a slower quenching speed, which results in an increased crystallization of the phase change material.

A programming signal can be applied to a selected memory cell to program the cell to a target state. A read signal can be applied to a selected memory cell to read the cell (e.g., to determine the state of the cell). The programming signal and the read signal can be current and/or voltage pulses, for example.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
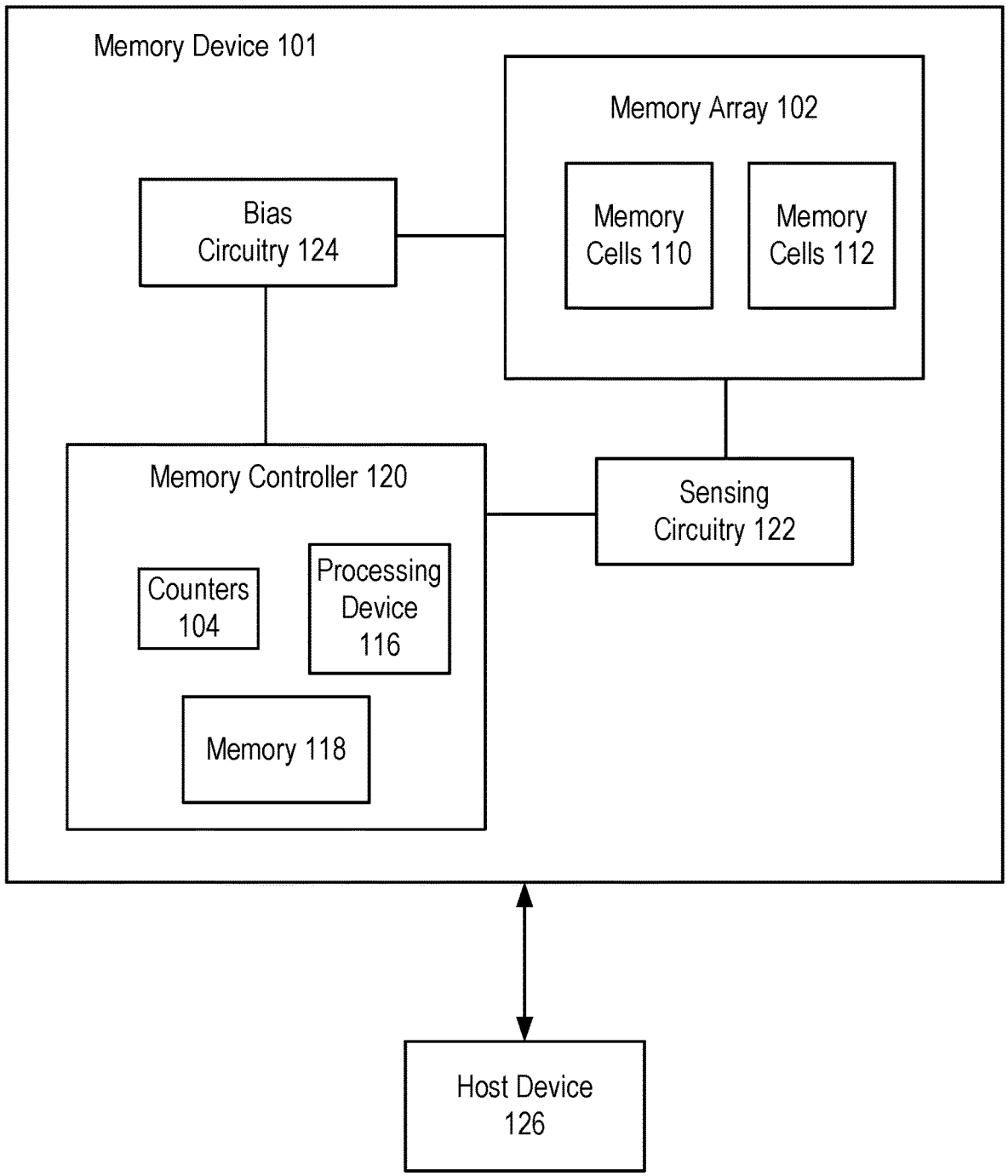
FIG. 1 shows a memory device that applies multiple pre-read voltages to memory cells of a memory array when performing write operations, in accordance with some embodiments.

The following disclosure describes various embodiments for memory devices that apply multiple pre-read voltages to memory cells when performing write operations. At least some embodiments herein relate to memory devices that use bipolar operations for a memory array. In one example, bipolar select voltages are used to select memory cells of the memory array. In one example, the memory cells are arranged in a cross-point architecture. In one example, each memory cell is formed using a single select device. In one example, the select device includes a chalcogenide material.

The memory device may, for example, store data used by a host device (e.g., a computing device of an autonomous vehicle, or another computing device that accesses data stored in the memory device). In one example, the memory device is a solid-state drive mounted in an electric vehicle.

In some cases, a memory device may include an array of memory cells arranged in a 3D architecture, such as a cross-point architecture to store the set of data. The memory cells in a cross-point architecture may represent a first logic state (e.g., a logic 1, a SET state) associated with a first set of threshold voltages, or a second logic state (e.g., a logic 0, a RESET state) associated with a second set of threshold voltages.

In some memory devices, a single pre-read voltage is applied to a memory cell prior to programming the memory cell. For example, the memory device may have memory cells that each include chalcogenide as a logic storage element. The pre-read voltage has a negative polarity, and the corresponding write voltage has a positive polarity. The pre-read voltage is applied in a single step to each memory cell in a memory array prior to applying the write voltage in a next step to program the memory cell as part of a programming operation.

When using chalcogenide as a logic storage element, as in the example above, the voltage requirements of the pre-read voltage and the write voltage are coupled. The negative pre-read voltage is applied to determine a number of bits triggered (e.g., memory cells for which a sense current exceeds a predetermined threshold value) that are in a SET' distribution for the negative pre-read polarity. The SET' distribution corresponds to a RESET distribution for a positive write polarity. For example, a high threshold voltage of a memory cell for the positive polarity corresponds to a low threshold voltage of the memory cell for the negative polarity. Similarly, a low threshold voltage of a memory cell for the positive polarity corresponds to high threshold voltage of the memory cell for the negative polarity.

The use of a pre-read voltage of a greater magnitude can reduce the magnitude of the write voltage that is required for programming memory cells. However, the use of a greater pre-read voltage can cause the memory device to consume more energy. Also, the use of a greater pre-read voltage can falsely trigger a larger fraction of the memory cells in the memory array (e.g., bits in a block of the memory array). In one example, the use of the greater pre-read voltage can falsely trigger bits in a RESET' distribution for a negative pre-read polarity. The RESET' distribution corresponds to a SET distribution for a positive write polarity.

The above can significantly degrade the endurance and performance of the memory device due to excessive energy consumption and/or lower endurance due to higher voltage cycling of memory cells, which may eventually include failure of the memory device to properly operate. As a result, a system that uses data from the memory device may malfunction. For example, a vehicle using the data for control of the vehicle could crash causing physical damage or physical injury.

To address these and other technical problems, a memory device determines in real-time when to apply multiple pre-read voltages to memory cells when performing write operations. In one example, first and second pre-read voltages are applied prior to programming memory cells. In one example, three or more pre-read voltages can be applied (e.g., to a selected portion of memory cells for which the first and second pre-read voltages were applied, for example where the portion of memory cells is selected based on results from applying the first and second pre-read voltages and/or based on a context of operation for the memory device as determined by a controller in real-time during operation).

In one embodiment, a first pre-read voltage is applied. A memory controller determines a percentage of memory cells for which a sense current exceeds a threshold (e.g., this is sometimes referred to as a percentage of cells that "snap"). If the percentage is low (e.g., five percent or less), then a second pre-read voltage is applied to those memory cells that did not yet snap. The second pre-read voltage has a greater magnitude (e.g., 100-500 mV) than the first pre-read voltage. The controller determines the additional memory cells that snap from applying the second pre-read voltage.

In one example, the controller uses one or more counters to count the number of cells that snap for each applied pre-read voltage. The controller also determines and stores the existing programming state of each memory cell as it snaps. The data stored by the snap counter(s) is used by the controller to make decisions on whether to apply additional pre-read voltage steps. In one example, the counter data is an input to an artificial neural network (ANN), which provides an output used to determine whether and what form of pre-read voltage to apply. Another input to the ANN is data regarding operating history and/or context of operation of the memory array and/or memory device.

Next, the memory cells are appropriately programmed depending on the programming mode to be implemented, the existing programming state of the cell (e.g., determined by whether the cell snapped), and/or the target programming state (e.g., corresponding to write commands and data received from a host device). In one example, the programming mode is a normal write mode. In one example, the programming mode is a force write mode.

In one example, codewords are read from a memory array. Typically, the codewords are adequately read using a single pre-read voltage. For example, 50% of memory cells corresponding to the codewords typically snap. No further pre-read voltage is applied, and the memory cells are programmed.

In some cases, codewords are stored in a portion of a memory array for which memory cells have suffered high drift and/or significant disturb (e.g., read disturb due to reading of adjacent memory cells). In this case, the percentage of cells that snap may be low (e.g., less than 5-10%), and the second pre-read voltage above is applied to perform the pre-read of the cells prior to programming.

In one embodiment, a memory device has a memory array including memory cells. A memory controller of the memory device is configured to: apply a first pre-read voltage to the memory cells (e.g., negative 2.5 V); sense a respective first current for each memory cell that results from applying the first pre-read voltage; determine a first portion of the memory cells for which the respective first current exceeds a first threshold (e.g., cells that snap), and a second portion of the memory cells for which the respective first current does not exceed the first threshold (e.g., cells that do not snap); and determine that the first portion of the memory cells is less than a threshold number (e.g., less than 5-10% of the total number of memory cells snap).

In response to determining that the first portion of the memory cells is less than the threshold number, the memory controller is further configured to: apply a second pre-read voltage (e.g., negative 2.8 V) to the second portion of the memory cells, wherein the second pre-read voltage has a same polarity as the first pre-read voltage, and is greater in magnitude than the first pre-read voltage; sense a respective second current for each memory cell in the second portion that results from applying the second pre-read voltage; and determine a third portion of the memory cells for which the respective second current exceeds a second threshold (e.g., an additional 45% of the total number of memory cells snap).

In one example, each memory cell includes chalcogenide as part of a select device (SD). In one example, each memory cell further includes a top electrode (e.g., carbon) above the chalcogenide, and a bottom electrode (e.g., carbon) below the chalcogenide.

Advantages provided by various embodiments as described herein for a memory device that applies multiple pre-read voltages to memory cells when performing write operations include one or more of the following: Energy consumption by the memory device can be reduced. The memory controller can dynamically customize a number and/or magnitude of pre-read voltages applied to memory cells as part of write operations. Bit line write voltages can be reduced. Endurance of the memory device can be increased (e.g., due to lower voltage cycling of the memory cells).

FIG. 1 shows a memory device 101 that applies multiple pre-read voltages to memory cells 110, 112 of a memory array 102 when performing write operations, in accordance with some embodiments. Memory device 101 has a memory controller 120 that applies the pre-read voltages. Memory controller 120 includes one or more processing devices 116 and memory 118. In one example, memory 118 stores firmware executed by processing device 116 to apply the pre-read voltages.

Memory controller 120 can use bias circuitry 124 to generate voltages for applying the pre-read voltages. Bias circuitry 124 can also generate voltages for applying write voltages to memory cells 110, 112 as part of programming operations. Bias circuitry 124 may further be used to generate read voltages for read operations performed on memory array 102 (e.g., in response to a read command from host device 126).

Memory device 101 includes sensing circuitry 122, which is used to sense a state of each memory cell in memory array 102. In one example, sensing circuitry 122 includes sense amplifiers used to detect a current caused by applying various voltages to memory cells in memory array 102. In one example, bias circuitry 124 applies a pre-read voltage to memory cells 110. Sensing circuitry 122 senses a current associated with each of the memory cells 110 caused by applying the pre-read voltage. In one example, the pre-read voltages are applied as described above.

In one example, if sensing circuitry 122 determines that the current for a memory cell is greater than a fixed threshold (e.g., a predetermined level of current), then memory controller 120 determines that the memory cell has snapped, as discussed above.

In one embodiment, memory cells 110 and memory cells 112 correspond to different memory types (e.g., single level cell, or triple level cell). In one example, the material used to form a select device of each memory cell is different. The pre-read voltage applied to memory cells 110 corresponds to the material used to form memory cells 110. The pre-read voltage applied to memory cells 112 is different and corresponds to the material used to form memory cells 112.

In one embodiment, the controller 120 determines to apply pre-read voltages to memory cells of memory array 102 based on a physical location of the memory cells in the memory array 102. In one example, the physical location is a distance from a row and/or column decoder (e.g., stored in a look-up table in memory 118). In one example, the physical location corresponds to an increased extent of drift or disturb (e.g., as determined from testing during manufacture, and/or sensor or other data during operation).

In one embodiment, the controller 120 determines to apply pre-read voltages to memory cells of memory array 102 based on a level of voltage biases that have previously been applied to particular memory cells in the memory array 102.

In one embodiment, memory controller 120 receives a write command from a host device 126. The write command is accompanied by data (e.g., user data of a user of host device 126) to be written to memory array 102. In response to receiving the write command, controller 120 initiates a programming operation by applying a first pre-read voltage to memory cells 110. Controller 120 determines a number of memory cells 110 that snap. Controller 120 uses this number to determine a percentage of memory cells 110 that snap. If the percentage is less than a fixed threshold, then controller 120 applies a second pre-read voltage to those memory cells 110 that did not snap when the first pre-read voltage was applied. In one embodiment, controller 120 uses one of counters 104 to count the number of memory cells that snap as each pre-read voltage is applied.

Next, controller 120 determines the particular cells of memory cells 110 for which a write voltage is to be applied to program the memory cell. In one embodiment, controller 120 determines whether the existing programming state (e.g., logic state zero) and the target programming state (e.g., logic state zero) for each cell are equal. If the existing and target programming states are equal, then no write voltage is applied (e.g., a normal write mode). If the existing and target programming states are different, then a write voltage is applied to that particular memory cell. In one example, the write voltage is 3-8 volts applied across the memory cell by applying voltage biases to the word line and bit line used to select the cell. In one example, in the case of a chalcogenide memory cell, a write voltage of a first polarity is applied to program the cell to a first logic state (e.g., set state), and a write voltage of a second opposite polarity is applied to program the cell to a second, different logic state (e.g., reset state).

In one embodiment, the second pre-read voltage is only applied to those memory cells that did not snap after applying the first pre-read voltage. In other embodiments, the second pre-read voltage can be applied to all memory cells whether or not they have already snapped (e.g. thresholded above a fixed current limit).

In one embodiment, a force write operation is performed in which particular memory cells are programmed to a target programming state without regard to whether the memory cell has snapped or not. In one example, the force write is performed in response to controller 120 determining that the percentage of memory cells that snap from applying the first pre-read voltage is below a fixed threshold number (e.g., less than 5% of cells, or less than a fixed count of cells). In one example, the force write is performed on all memory cells for which the first pre-read voltage was applied. In one example, the force write is performed only on those memory cells that did not snap until the higher, second pre-read voltage was applied. In one example, the force write is performed to make the memory cell more robust in its ability to reliably store the target logic state.

In one example, controller 120 may use write voltages (e.g., write pulses) to write a logic state to a memory cell, such as memory cell 110, 112 during a write operation. The write pulses may be applied by providing a first voltage to a bit line and providing a second voltage to a word line to select the memory cell. Circuits coupled to access lines to which memory cells may be coupled may be used to provide the write voltages (e.g., access line drivers included in decoder circuits). The circuits may be controlled by internal control signals provided by a control logic (e.g., controller 120). The resulting voltage applied to the memory cell is the difference between the first and second voltages. The write pulses may be the same duration as read pulses in some embodiments. In some embodiments the duration is 10-50 ns. In some embodiments, the duration is 1-100 ns. In some embodiments, the duration is 1 ns to 1 microsecond. Writing to the memory cell may take the same time as reading the memory cell in some embodiments.

In one example, the polarity of the write pulses may be either a first polarity or a second polarity (e.g., forward or reverse). For example, a write pulse may apply a voltage to a memory cell in a first polarity (e.g., bit line at 6V and word line at 0V).

In one example, circuits coupled to access lines to which memory cells may be coupled are used to provide read pulses (e.g., access line drivers included in decoder circuits). The circuits may be controlled by internal control signals provided by a control logic (e.g., controller 120). A read voltage or pulse may be a voltage applied to a memory cell for a period of time (e.g., 10-50 ns, 1-100 ns, 1 ns to 1 microsecond). In some embodiments, the read pulse may be a square pulse. In some embodiments, the read pulse may be a ramp, that is, a linearly-increasing voltage may be applied across the memory cell.

In one example, for chalcogenide memory cells, the read voltages are always applied with the same fixed polarity. In one example, the pre-read voltages have the same polarity, and the polarity of the read voltages is opposite to the pre-read voltages.

In one example, after being accessed (e.g., selected), a memory cell may be read, or sensed, by a sense component (e.g., sensing circuitry 122) to determine the stored state of the memory cell. For example, a voltage may be applied to the memory cell (using a word line and bit line) and the presence of a resulting current may depend on the applied voltage and the threshold voltage of the memory cell. In some cases, more than one voltage may be applied. Additionally, if an applied voltage does not result in current flow, other voltages may be applied until a current is detected by the sense component. By assessing the voltage that resulted in current flow, the stored logic state of the memory cell may be determined. In some cases, the voltage may be ramped up in magnitude until a current flow is detected (e.g., a memory cell turns on, switches on, conducts current, or becomes activated). In other cases, predetermined voltages may be applied sequentially until a current is detected. Likewise, a current may be applied to a memory cell, and the magnitude of the voltage to create the current may depend on the electrical resistance or the threshold voltage of the memory cell.

In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

The sense component may include various transistors or amplifiers in order to detect and amplify a difference in the signals. The detected logic state of the memory cell may then be output through a column decoder as output. In some cases, the sense component may be part of a column decoder or a row decoder.

Figure 2:
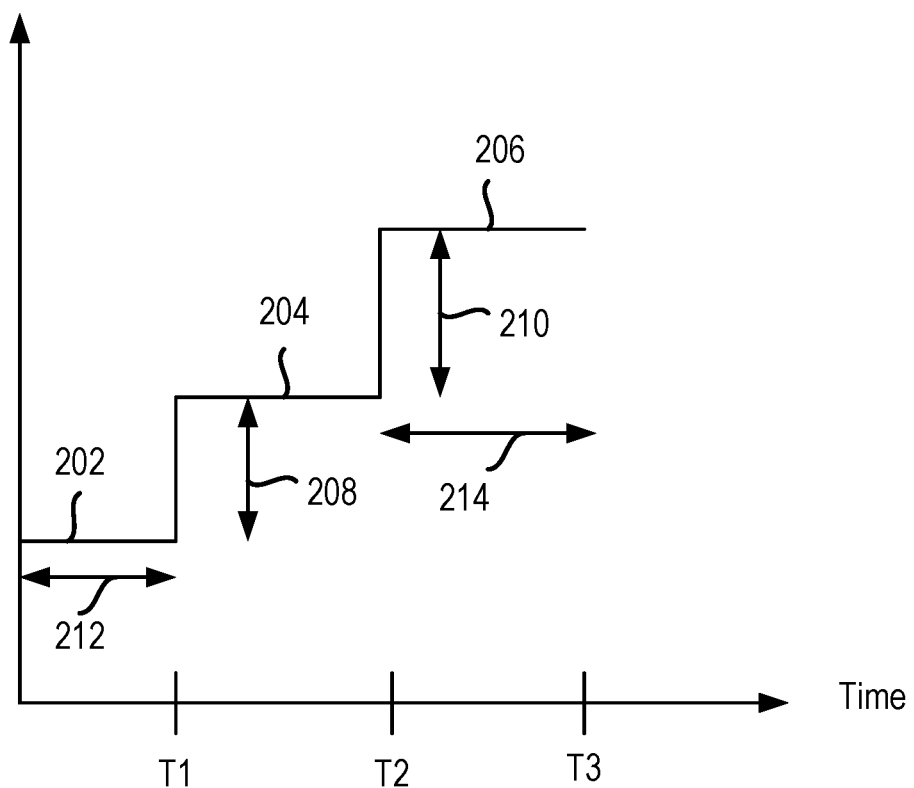
FIG. 2 shows a graph illustrating multi-step pre-read voltages applied to memory cells when performing write operations, in accordance with some embodiments.

FIG. 2 shows a graph illustrating multi-step pre-read voltages applied to memory cells when performing write operations, in accordance with some embodiments. In one example, the pre-read voltages are applied to memory cells 110 or 112 as discussed above for write operations on memory array 102. In one example, the pre-read voltages are generated by bias circuitry 124 as controlled by controller 120. In one example, memory cells 110 are single-level cells (SLCs).

The vertical axis indicates the pre-read voltage magnitude, and the horizontal axis indicates time. In one example, the pre-read voltage is a voltage difference applied across a memory cell from a voltage-biased word line and a voltage-biased bit line that are used to select the cell.

The pre-read voltages can be applied in multiple steps 202, 204, 206, etc., as desired. Each level of pre-read voltage can be applied for various lengths of time 212, 214. In one example, time 212, 214 ranges between 10-100 nanoseconds.

The differences 208, 210 in voltage between each step can be varied. In one example, voltage difference 208, 210 ranges between 50-600 millivolts. In one example, voltage difference 208, 210 ranges between 100-300 millivolts.

In one embodiment, at time T1, after applying pre-read voltage 202, counter 104 is used to determine a number of memory cells 110 that have snapped. Controller 120 determines whether to apply pre-read voltage 204 based on counter 104.

Similar determinations of a number of memory cells 110 that have snapped are made at times T2, T3, etc., as desired. Controller 120 uses a number of memory cells 110 that have snapped as determined by counters 104 to determine whether to apply additional steps of pre-read voltages.

In the example illustrated in FIG. 2, the pre-read voltages 202, 204 are of the same polarity (e.g., as used with SLC memory cells). In other embodiments, the memory cells can be multi-state cells, such as MLC, TLC, etc. In one example, in the case of MLC cells, the second pre-read voltage 204 has an opposite polarity to the first pre-read voltage 202.

In one example, for MLC memory cells, a snap counter determines that a first pre-read voltage (of either a negative or positive polarity) does not snap a sufficient number of cells. As a result, the controller determines to apply the second pre-read voltage, and determines that a sufficient number of cells snap. The controller then applies a third pre-read voltage of an opposite polarity to the second pre-read voltage. In another case, a snap counter determines that the second pre-read voltage does not snap a sufficient number of cells. As a result, the controller applies a third pre-read voltage of greater magnitude than the second pre-read voltage, and of the same polarity as the second pre-read voltage. Then, the controller applies a fourth pre-read voltage of a polarity that is opposite to the third pre-read voltage.

Figure 3:
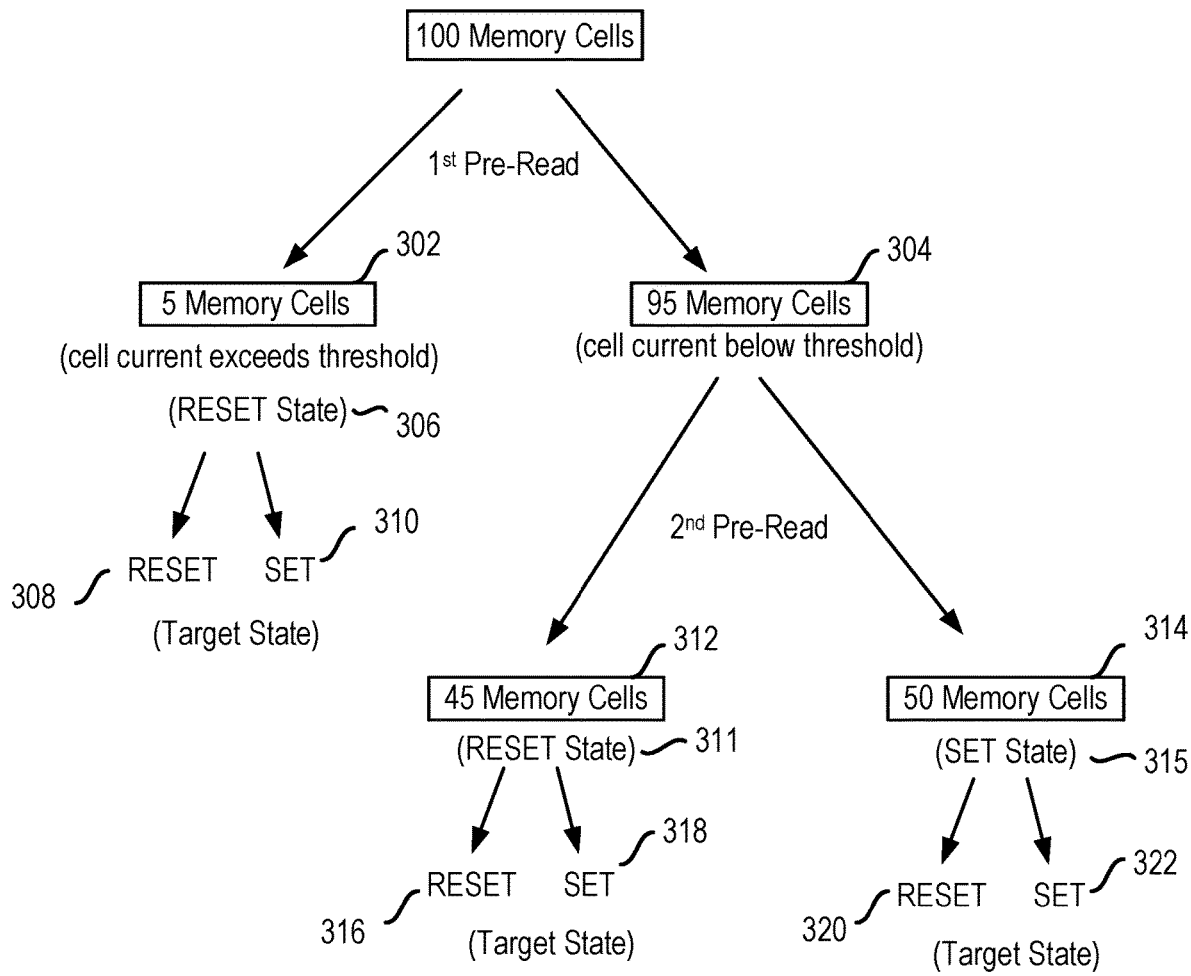
FIG. 3 shows an example of determining programming states of memory cells by applying multiple pre-read voltages to the memory cells during write operations, in accordance with some embodiments.

FIG. 3 shows an example of determining programming states of memory cells by applying multiple pre-read voltages to the memory cells during write operations, in accordance with some embodiments. In one example, the memory cells are memory cells 110, and the pre-read voltages are implemented by memory controller 120.

Merely as a non-limiting example for purposes of illustration, a first pre-read voltage is applied to a total number of 100 memory cells. A current through each memory cell is sensed by a sense amplifier(s). Memory cells 302 have a current that exceeds a fixed threshold value and are considered to snap. Memory cells 304 have a current that is below the fixed threshold value and are considered not to snap.

In this example, only five memory cells have snapped, which is only five percent of the total number of 100 memory cells. A memory controller determines based on this result that a second pre-read voltage is to be applied to those memory cells 304 that did not snap.

After applying the second pre-read voltage, memory cells 312 have a current that exceeds a fixed threshold value (e.g., a fixed current limit) and are considered to snap. Memory cells 314 have a current that does not exceed the fixed threshold value and are considered not to snap. In this example, after applying the first and second pre-read voltages and sensing the current in each memory cell, memory cells 302, 312 are considered to have snapped, and memory cells 314 are considered not to have snapped.

For this example, based on the determination by the memory controller of those cells that have snapped, the memory controller determines that memory cells 302, 312 are in a first logic state 306, 311 (e.g., a reset state). The memory controller further determines based on these results that memory cells 314 are in a second logic state 315 (e.g., a set state).

In one embodiment, if the percentage of memory cells 312 that snap is less than a fixed threshold percentage of memory cells 304 (e.g., only 3 cells snap of the 95 cells 304), then the memory controller can determine to apply a third pre-read voltage, similarly as discussed above for applying the second pre-read voltage. Additional steps of pre-read voltage can be applied similarly as desired. The threshold percentage can be different for determining whether to apply each next step of voltage.

After determining the existing programming state of each memory cell as discussed above, the memory controller makes a determination of a mode of programming to use for programming the memory cells. In one embodiment, a normal write programming mode is used. In this mode, the controller determines the target state for each memory cell.

In one example of a normal write programming mode, memory cells 302, 312 are in a reset state. For each such cell that has a target set state 310, 318, a write voltage is applied to the memory cell. For each such cell that has a target reset state 308, 316, no write voltage is applied to the cell.

For example, memory cells 314 are in a set state 315. For each such cell that has a target reset state 320, a write voltage is applied to the cell. For each such cell that has a target set state 322, no write voltage is applied.

In one embodiment, the controller determines to implement a force write programming mode. In this mode, each memory cell is selected and an appropriate programming write voltage is applied to the memory cell based on the target state. For example, memory cells 312 are programmed to target reset state 316 even though memory cells 312 are already in an existing programming reset state 311.

Figure 4:
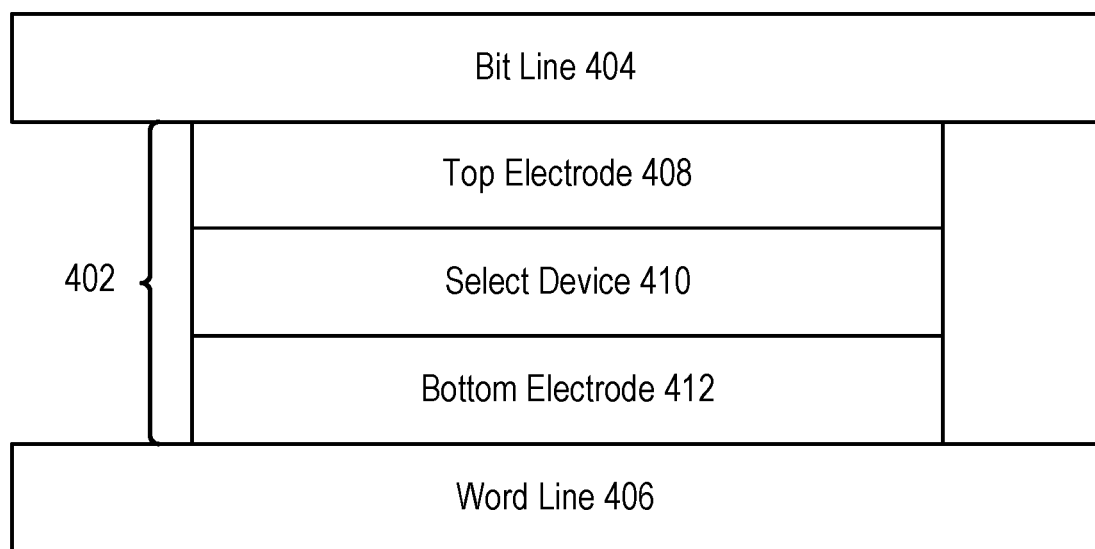
FIG. 4 shows an example of a memory cell that includes a select device, in accordance with some embodiments.

FIG. 4 shows an example of a memory cell 402 that includes a select device 410, in accordance with some embodiments. In one example, select device 410 includes a chalcogenide. Memory cell 402 is an example of memory cells 110, 112.

Top electrode 408 conductively connects select device 410 to bit line 404, and bottom electrode 412 conductively connects select device 410 to word line 406. In one example, electrodes 408, 412 are formed of a carbon material.

In one example, select device 410 includes a chalcogenide (e.g., chalcogenide material and/or chalcogenide alloy). Threshold voltage properties of the select device may be based on the voltage polarities applied to the memory cell.

In one example, a logic state may be written to memory cell 402, which may correspond to one or more bits of data. A logic state may be written to the memory cell by applying voltages of different polarities at different voltage and/or current magnitudes. The memory cell may be read by applying voltages of a single polarity. The writing and reading protocols may take advantage of different threshold voltages of the select device that result from the different polarities. In one example, the memory cell may require short, relatively low power pulses to read. The chalcogenide material of the select device may or may not undergo a phase change during reading and/or writing. In some cases, the chalcogenide material may not be a phase change material.

Figure 5:
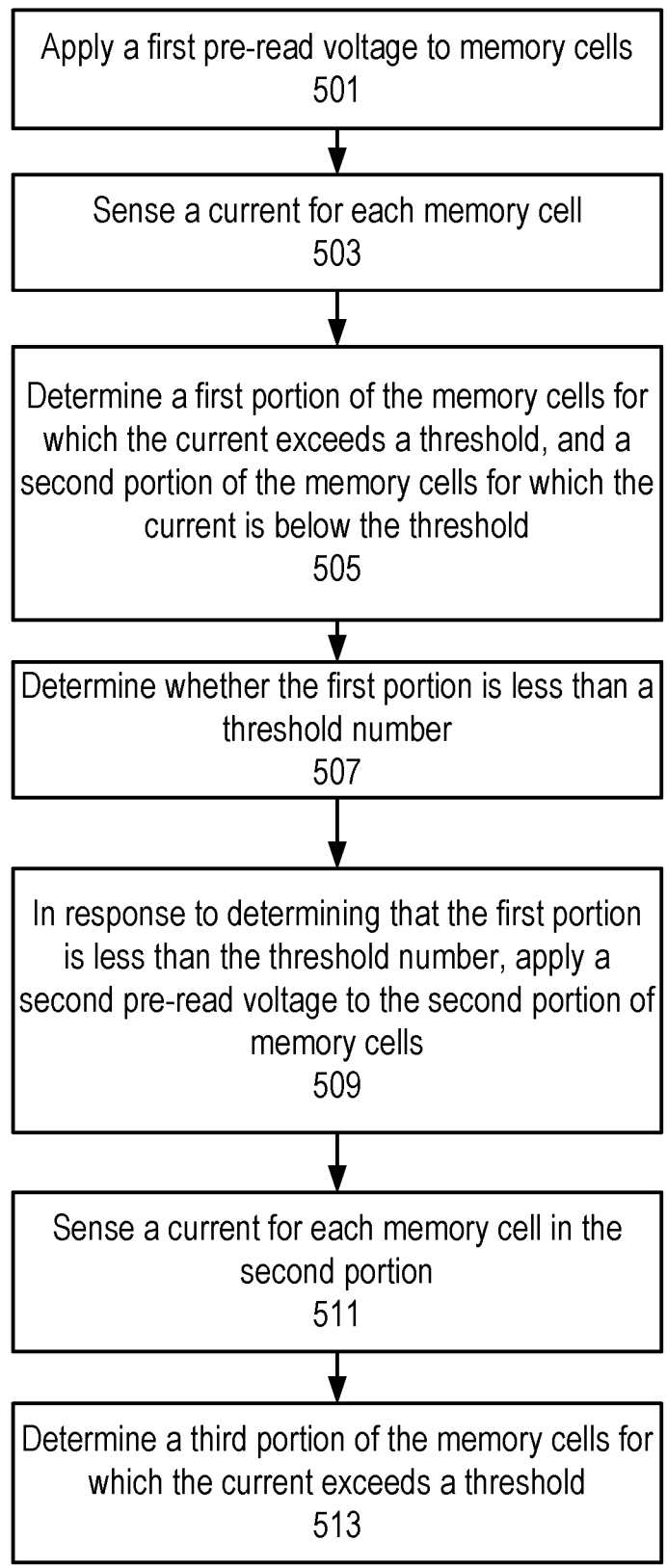
FIG. 5 shows a method for determining existing programming states of memory cells by applying multiple pre-read voltages, in accordance with some embodiments.

FIG. 5 shows a method for determining existing programming states of memory cells by applying multiple pre-read voltages, in accordance with some embodiments. For example, the method of FIG. 5 can be implemented in the system of FIG. 1. In one example, memory controller 120 applies multiple pre-read voltages to memory cells 110 when performing write operations.

The method of FIG. 5 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 5 is performed at least in part by one or more processing devices (e.g., processing device 116 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 501, a first pre-read voltage is applied to memory cells. In one example, controller 120 applies a first pre-read voltage 202 to memory cells 110.

At block 503, a current is sensed for each memory cell. In one example, sensing circuitry 122 senses a current for each memory cell 110.

At block 505, a first portion of the memory cells for which the current exceeds a threshold is determined. A second portion of the memory cells for which the current is below the threshold is determined. In one example, the first portion is memory cells 302, and the second portion is memory cells 304 of FIG. 3.

At block 507, a determination is made whether the first portion is less than the threshold number. In one example, the first portion of memory cells 302 is five memory cells, which is only five percent of the total number of memory cells. The threshold number is a fixed value of seven percent, so controller 120 determines to apply second pre-read voltage 204 to the second portion of memory cells 304. In one example, the threshold number is determined in real-time by controller 120 based on an output from an artificial neural network. In one example, the inputs to the artificial neural network are data from counters 104 and/or data from sensors of the memory device 101 and/or other sensors. In one example, the sensors provide sensor data regarding a context of operation of memory device 101 and/or a device that uses memory device 101, such as an autonomous vehicle.

At block 509, in response to determining that the first portion is less than the threshold number, a second pre-read voltage is applied to the second portion of the memory cells. In one example, controller 120 uses bias circuitry 124 to apply the second pre-read voltage to those of memory cells 110 that did not snap when the first pre-read voltage was applied.

At block 511, a current is sensed for each memory cell in the second portion. In one example, the current is sensed by sense amplifiers of sensing circuitry 122.

At block 513, a third portion of the memory cells for which the current exceeds a threshold is determined. In one example, the third portion is memory cells 312 that are determined to snap (e.g., determined by controller 120 to be in a RESET state).

In one embodiment, a system includes: a memory array (e.g., 102) including memory cells; and a controller (e.g., 120) configured to: apply a first pre-read voltage to the memory cells; sense a respective first current for each memory cell that results from applying the first pre-read voltage; determine a first portion of the memory cells for which the respective first current exceeds a first threshold, and a second portion of the memory cells for which the respective first current does not exceed the first threshold; and determine that the first portion of the memory cells is less than a threshold number.

In response to determining that the first portion of the memory cells is less than the threshold number, the controller is further configured to: apply a second pre-read voltage to the second portion of the memory cells, where the second pre-read voltage has a same polarity as the first pre-read voltage, and is greater in magnitude than the first pre-read voltage; sense a respective second current for each memory cell in the second portion that results from applying the second pre-read voltage; and determine a third portion of the memory cells for which the respective second current exceeds a second threshold.

In one embodiment, each memory cell includes chalcogenide.

In one embodiment, each memory cell further includes a top carbon electrode above the chalcogenide, and a bottom carbon electrode below the chalcogenide.

In one embodiment, a method includes: applying a first read voltage to memory cells of a memory array; sensing a respective first current for each memory cell that results from applying the first read voltage; determining a first portion of the memory cells for which the respective first current exceeds a first threshold, and a second portion of the memory cells for which the respective first current does not exceed the first threshold; and determining whether the first portion of the memory cells is less than a threshold number (e.g., less than 5-10 percent of a total number of cells to which a first pre-read voltage is applied).

The method further includes, in response to determining that the first portion of the memory cells is less than the threshold number: applying a second read voltage to the second portion of the memory cells, where the second read voltage is greater in magnitude than the first read voltage (e.g., greater by at least 100 mV); sensing a respective second current for each memory cell in the second portion that results from applying the second read voltage; and determining a third portion of the memory cells for which the respective second current exceeds a second threshold.

In one embodiment, the threshold number is five percent of a total number of the memory cells.

In one embodiment, the first read voltage is a first pre-read voltage, the second read voltage is a second pre-read voltage, the first pre-read voltage and the second pre-read voltage have a same polarity, and the second pre-read voltage is greater in magnitude than the first pre-read voltage by at least 100 millivolts.

In one embodiment, the method further includes: comparing an existing programming state (e.g., RESET state) for each of the memory cells to a target programming state for the memory cell (e.g., SET state); determining, based on comparing the existing programming state to the target programming state for each memory cell, a fourth portion of the memory cells to be programmed; and applying a write voltage to the fourth portion of the memory cells, where the respective write voltage applied to each memory cell corresponds to the target programming state of the memory cell.

In one embodiment, the write voltage applied to each memory cell has a first polarity when programming to a first logic state, and has an opposite second polarity when programming to a second logic state.

In one embodiment, the target programming state is a logic state corresponding to a write command received from a host device (e.g., 126).

In one embodiment, the method further includes reading each of the memory cells by applying a third read voltage to the memory cell, where the third read voltage has a polarity that is opposite to a polarity of the first read voltage and the second read voltage. In one example, the third read voltage is applied to a block of memory cells in memory array 102 in response to receiving a read command from host device 126.

In one embodiment, each memory cell includes chalcogenide as a logic storage element, the existing programming state for the first portion and the third portion of the memory cells is a RESET state, and the target programming state for at least part of the first portion and the third portion of the memory cells is a SET state.

In one embodiment, the first threshold and the second threshold are equal (e.g., the first and second thresholds are equal to a fixed current limit). In other embodiments, the thresholds can be different.

In one embodiment, a non-transitory computer-readable medium stores instructions which, when executed on at least one processing device, cause the at least one processing device to: apply a first read voltage to memory cells of a memory array, where each memory cell includes chalcogenide; sense a respective first current for each memory cell that results from applying the first read voltage; determine a first portion of the memory cells for which the respective first current exceeds a threshold, and a second portion of the memory cells for which the respective first current does not exceed the threshold; and determine whether the first portion of the memory cells is less than a threshold number. The instructions further cause the processing device to, in response to determining that the first portion of the memory cells is less than the threshold number: apply a second read voltage to the second portion of the memory cells, where the second read voltage is greater in magnitude than the first read voltage; sense a respective second current for each memory cell in the second portion that results from applying the second read voltage; and determine a third portion of the memory cells for which the respective second current exceeds a threshold.

In one embodiment, the instructions further cause the at least one processing device to: apply a write voltage to at least part of the third portion of the memory cells; and after applying the write voltage, read the third portion of the memory cells using a third read voltage, where the third read voltage has an opposite polarity to the first read voltage and the second read voltage.

Figure 6:
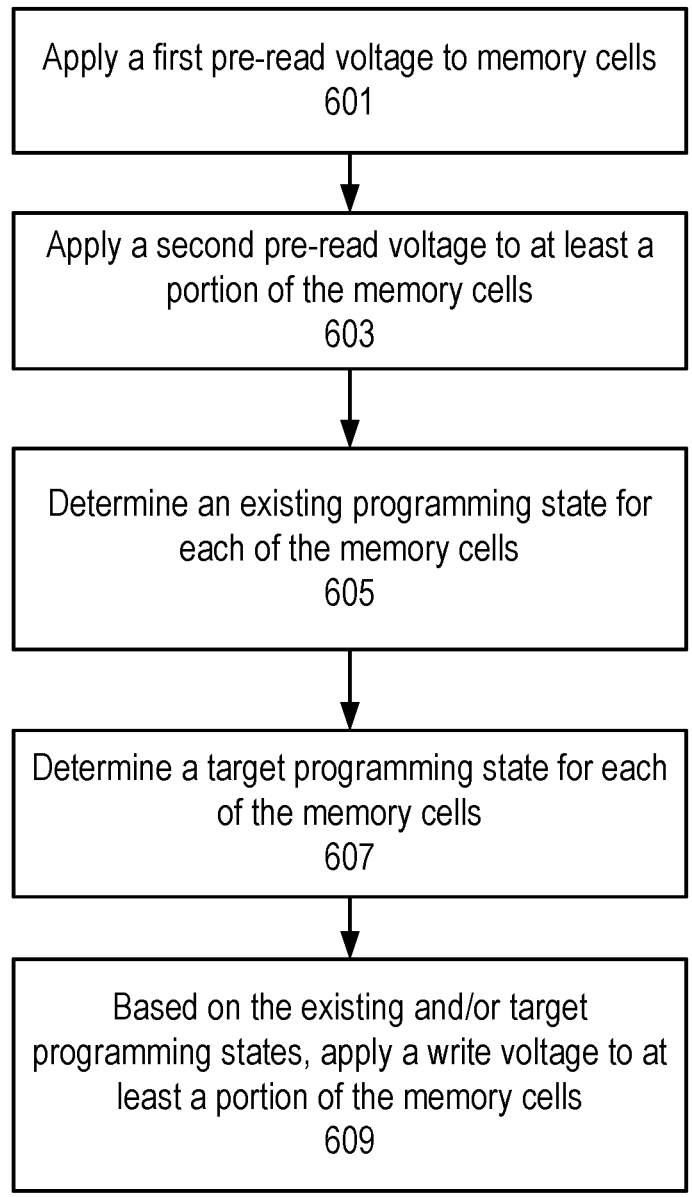
FIG. 6 shows a method for applying a write voltage to memory cells based on programming states of the memory cells, in accordance with some embodiments.

FIG. 6 shows a method for applying a write voltage to memory cells based on programming states of the memory cells, in accordance with some embodiments. For example, the method of FIG. 6 can be implemented in the system of FIG. 1. In one example, memory controller 120 causes bias circuitry 124 to apply the write voltage to memory cells 110.

The method of FIG. 6 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 6 is performed at least in part by one or more processing devices (e.g., processing device 116 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 601, a first pre-read voltage is applied to memory cells. In one example, controller 120 applies a first pre-read voltage to memory cells 110 in response to receiving a write command from host device 126.

At block 603, a second pre-read voltage is applied to at least a portion of the memory cells. In one example, the portion of memory cells 302 that snap is below a threshold percentage or number. In response, controller 120 applies the second pre-read voltage.

At block 605, an existing programming state is determined for each of the memory cells. In one example, controller 120 determines the existing programming state for each of memory cells 110 based on the results from blocks 601, 603 above.

At block 607, a target programming state is determined for each of the memory cells. In one example, controller 120 determines a target logic value for bits corresponding to memory cells 110. The target logic value for the bits corresponds to data to be written in response to a write command received from host device 126. In one example, the data to be written is one or more pages of data received from host device 126 over a serial data bus. The pages of data are associated with the write command.

At block 609, based on the existing and/or target programming states, a write voltage is applied to at least a portion of the memory cells. In one example, bias circuitry 124 applies a write voltage having a polarity that corresponds to the target programming state for at least part of the memory cells 110.

In one embodiment, a system includes: a memory array including memory cells, each memory cell (e.g., 402) including a select device (e.g., 410); and a memory controller configured to: apply a first pre-read voltage to the memory cells; sense a respective first current for each memory cell that results from applying the first pre-read voltage; determine a first portion of the memory cells for which the respective first current exceeds a first threshold, and a second portion of the memory cells for which the respective first current does not exceed the first threshold; determine that the first portion of the memory cells is less than a threshold number; and in response to determining that the first portion of the memory cells is less than the threshold number: apply a second pre-read voltage to the second portion of the memory cells, where the second pre-read voltage has a same polarity as the first pre-read voltage, and is greater in magnitude than the first pre-read voltage; sense a respective second current for each memory cell in the second portion that results from applying the second pre-read voltage; and determine a third portion of the memory cells for which the respective second current exceeds a second threshold.

In one embodiment, the first pre-read voltage is applied to the memory cells as part of a programming operation, and the programming operation is performed in response to receiving a write command from a host device (e.g., 126).

In one embodiment, the controller is further configured to apply a write voltage to a fourth portion of the memory cells, where the write voltage has a first polarity when programming the memory cells to a first logic state (e.g., a reset state), and has an opposite second polarity when programming the memory cells to a second logic state (e.g., a set state).

In one embodiment, the controller is further configured to, after applying the write voltage, read the fourth portion of the memory cells using a read voltage, where the read voltage has an opposite polarity to the first pre-read voltage and the second pre-read voltage. In one example, controller 120 uses the read voltage in response to receiving a read command from host device 126.

In one embodiment, the fourth portion includes memory cells from at least one of the first portion or the second portion. In one example, controller 120 applies the read voltage to read memory cells 302, 312, and/or 314.

In one embodiment, an existing programming state for the memory cells in the third portion (e.g., memory cells 312) is a first logic state (e.g., reset state 311), and a target programming state for at least part of the memory cells in the third portion is a second logic state (e.g., set state 318).

In one embodiment, for each memory cell in a fourth portion of the memory cells, an existing logic state and a target logic state requested by a host device are equal (e.g., set state 315 and set state 322 are equal logic states); and the controller is further configured to, in response to determining that the first portion (e.g., memory cells 302) of the memory cells is less than the threshold number (e.g., less than seven percent), apply a write voltage to each memory cell in the fourth portion, where the applied write voltage corresponds to the target logic state for the memory cell. In one example, controller 120 implements a force write programming mode in response to determining that the percentage of memory cells 302 is less than seven percent.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement some of the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In one example, the host system is host device 126. In one example, the memory sub-system is memory device 101.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A system comprising:
a memory array including memory cells; and
a controller configured to:
apply a first pre-read voltage to the memory cells;
sense a respective first current for each memory cell that results from applying the first pre-read voltage;
determine a first portion of the memory cells for which the respective first current exceeds a first threshold, and a second portion of the memory cells for which the respective first current does not exceed the first threshold;
determine that the first portion of the memory cells is less than a threshold number; and
in response to determining that the first portion of the memory cells is less than the threshold number:
apply a second pre-read voltage to the second portion of the memory cells, wherein the second pre-read voltage is greater in magnitude than the first pre-read voltage;
sense a respective second current for each memory cell in the second portion that results from applying the second pre-read voltage; and
determine a third portion of the memory cells for which the respective second current exceeds a second threshold.

2. The system of claim 1, wherein each memory cell comprises chalcogenide.

3. The system of claim 2, wherein each memory cell further comprises a top carbon electrode above the chalcogenide, and a bottom carbon electrode below the chalcogenide.

4. The system of claim 1, wherein the first pre-read voltage is applied to the memory cells as part of a programming operation, and the programming operation is performed in response to receiving a write command from a host device.

5. The system of claim 1, wherein the controller is further configured to apply a write voltage to a fourth portion of the memory cells, wherein the write voltage has a first polarity when programming the memory cells to a first logic state, and has an opposite second polarity when programming the memory cells to a second logic state.

6. The system of claim 5, wherein the controller is further configured to, after applying the write voltage, read the fourth portion of the memory cells using a read voltage, wherein the read voltage has an opposite polarity to the first pre-read voltage and the second pre-read voltage.

7. The system of claim 5, wherein the fourth portion includes memory cells from at least one of the first portion or the second portion.

8. The system of claim 1, wherein an existing programming state for the memory cells in the third portion is a first logic state, and a target programming state for at least part of the memory cells in the third portion is a second logic state.

9. The system of claim 1, wherein:
for each memory cell in a fourth portion of the memory cells, an existing logic state and a target logic state requested by a host device are equal; and
the controller is further configured to, in response to determining that the first portion of the memory cells is less than the threshold number, apply a write voltage to each memory cell in the fourth portion, wherein the applied write voltage corresponds to the target logic state for the memory cell.

10. A method comprising:
applying a first read voltage to memory cells of a memory array;
sensing a respective first current for each memory cell that results from applying the first read voltage;
determining a first portion of the memory cells for which the respective first current exceeds a first threshold, and a second portion of the memory cells for which the respective first current does not exceed the first threshold;
determining whether the first portion of the memory cells is less than a threshold number; and in response to determining that the first portion of the memory cells is less than the threshold number:
  applying a second read voltage to the second portion of the memory cells, wherein the second read voltage is greater in magnitude than the first read voltage;
  sensing a respective second current for each memory cell in the second portion that results from applying the second read voltage; and
  determining a third portion of the memory cells for which the respective second current exceeds a second threshold.

11. The method of claim 10, wherein the threshold number is five percent of a total number of the memory cells.

12. The method of claim 10, wherein the first read voltage is a first pre-read voltage, the second read voltage is a second pre-read voltage, the first pre-read voltage and the second pre-read voltage have a same polarity, and the second pre-read voltage is greater in magnitude than the first pre-read voltage by at least 100 millivolts.

13. The method of claim 10, further comprising:
  comparing an existing programming state for each of the memory cells to a target programming state for the memory cell;
  determining, based on comparing the existing programming state to the target programming state for each memory cell, a fourth portion of the memory cells to be programmed; and
  applying a write voltage to the fourth portion of the memory cells, wherein the respective write voltage applied to each memory cell corresponds to the target programming state of the memory cell.

14. The method of claim 13, wherein the write voltage applied to each memory cell has a first polarity when programming to a first logic state, and has an opposite second polarity when programming to a second logic state.

15. The method of claim 13, wherein the target programming state is a logic state corresponding to a write command received from a host device.

16. The method of claim 13, further comprising reading each of the memory cells by applying a third read voltage to the memory cell, wherein the third read voltage has a polarity that is opposite to a polarity of the first read voltage and the second read voltage.

17. The method of claim 13, wherein each memory cell comprises chalcogenide as a logic storage element, the existing programming state for the first portion and the third portion of the memory cells is a reset state, and the target programming state for at least part of the first portion and the third portion of the memory cells is a set state.

18. The method of claim 10, wherein the first threshold and the second threshold are equal.

19. A non-transitory computer-readable medium storing instructions which, when executed on at least one processing device, cause the at least one processing device to:
  apply a first read voltage to memory cells of a memory array, wherein each memory cell comprises chalcogenide;
  sense a respective first current for each memory cell that results from applying the first read voltage;
  determine a first portion of the memory cells for which the respective first current exceeds a threshold, and a second portion of the memory cells for which the respective first current does not exceed the threshold;
  determine whether the first portion of the memory cells is less than a threshold number; and
  in response to determining that the first portion of the memory cells is less than the threshold number:
    apply a second read voltage to the second portion of the memory cells, wherein the second read voltage is greater in magnitude than the first read voltage;
    sense a respective second current for each memory cell in the second portion that results from applying the second read voltage; and
    determine a third portion of the memory cells for which the respective second current exceeds a threshold.

20. The non-transitory computer-readable medium of claim 19, wherein the instructions further cause the at least one processing device to:
  apply a write voltage to at least part of the third portion of the memory cells; and
  after applying the write voltage, read the third portion of the memory cells using a third read voltage, wherein the third read voltage has an opposite polarity to the first read voltage and the second read voltage.

* * * * *